United States Patent
Oshige

(10) Patent No.: US 10,367,102 B2
(45) Date of Patent: Jul. 30, 2019

(54) ELECTRONIC COMPONENT AND EQUIPMENT

(71) Applicant: CANON KABUSHIKI KAISHA, Tokyo (JP)

(72) Inventor: Hidemasa Oshige, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/910,882

(22) Filed: Mar. 2, 2018

(65) Prior Publication Data

US 2018/0261701 A1 Sep. 13, 2018

(30) Foreign Application Priority Data

Mar. 9, 2017 (JP) ................. 2017-044645

(51) Int. Cl.
*H01L 31/02* (2006.01)
*H01L 31/0203* (2014.01)
*H01L 27/146* (2006.01)

(52) U.S. Cl.
CPC .... *H01L 31/0203* (2013.01); *H01L 31/02005* (2013.01); *H01L 27/146* (2013.01)

(58) Field of Classification Search
CPC ........... H01L 31/0203; H01L 31/02005; H01L 27/146
See application file for complete search history.

(56) References Cited

U.S. PATENT DOCUMENTS

| | | | |
|---|---|---|---|
| 5,986,334 A | 11/1999 | Lee | |
| 7,192,796 B2 | 3/2007 | Zilber et al. | |
| 8,211,750 B2 | 7/2012 | Ohsumi | |
| 8,558,392 B2 * | 10/2013 | Chua | H01L 21/561 257/676 |
| 9,559,028 B2 * | 1/2017 | Takeda | H01L 23/13 |

FOREIGN PATENT DOCUMENTS

| | | |
|---|---|---|
| JP | H10-308477 A | 11/1998 |
| JP | 2006-128625 A | 5/2006 |
| JP | 2007-528120 A | 10/2007 |
| JP | 2011-165775 A | 8/2011 |
| JP | 2011-243624 A | 12/2011 |
| JP | 2012-182309 A | 9/2012 |
| JP | 2012-191016 A | 10/2012 |
| JP | 2014-175853 A | 9/2014 |
| JP | 2015-002414 A | 1/2015 |
| JP | 2016-031968 A | 3/2016 |
| JP | 2016-034021 A | 3/2016 |
| JP | 2016-100554 A | 5/2016 |

* cited by examiner

*Primary Examiner* — Selim U Ahmed
(74) *Attorney, Agent, or Firm* — Venable LLP

(57) ABSTRACT

An electronic component includes a support member in which a recess part having a bottom face and a side face is provided, and a device unit that includes a substrate and is fixed to the support member so that a primary face of the substrate faces the recess part. An opening width of the recess part is, on the side of the bottom of the recess part with respect to the primary face, narrower than the width of the device unit and, on the opposite side of the bottom of the recess part with respect to the primary face, wider than the width of the device unit. An end face of the substrate overlaps with the side face of the recess part in a direction perpendicular to the primary face of the substrate. A photoelectric conversion element is arranged on the primary face of the substrate.

20 Claims, 10 Drawing Sheets

ELECTRONIC COMPONENT AND EQUIPMENT

BACKGROUND OF THE INVENTION

Field of the Invention

The present invention relates to an electronic component and a method of manufacturing the electronic component.

Description of the Related Art

Electronic components configured such that a device unit in which elements such as a transistor or a diode and interconnections are provided on a semiconductor substrate is fixed to a support member have been proposed. Japanese Patent Application Laid-Open No. 2012-182309 discloses an optical device in which an optical element is accommodated within a recess of an accommodation member having the recess at the center.

In the electronic component disclosed in Japanese Patent Application Laid-Open No. 2012-182309, however, there is a problem that sufficient reduction in size cannot be achieved.

SUMMARY OF THE INVENTION

An object of the present invention is to provide a technology that is advantageous for reduction in the size of an electronic component.

According to one aspect of the present invention, there is provided an electronic component including a support member in which a recess part having a bottom face and a side face is provided, and a device unit that includes a substrate and is fixed to the support member so that a primary face of the substrate faces the recess part, wherein an opening width of the recess part is, on a side of a bottom of the recess part with respect to the primary face, narrower than a width of the device unit and, on an opposite side of the bottom of the recess part with respect to the primary face, wider than the width of the device unit, wherein an end face of the substrate overlaps with the side face of the recess part in a direction perpendicular to the primary face of the substrate, and wherein a photoelectric conversion element is arranged on the primary face of the substrate.

Further, according to another aspect of the present invention, there is provided an electronic component including a support member in which a recess part having a bottom face and a side face is provided, a device unit that includes a substrate and is fixed to the support member so that a primary face of the substrate is parallel to the bottom face of the recess part, and a resin member provided between an end face of the device unit and the side face of the recess part, wherein an opening width of the recess part is, on a side of a bottom of the recess part with respect to the primary face, narrower than a width of the device unit and, on an opposite side of the bottom of the recess part with respect to the primary face, wider than the width of the device unit, wherein a void is provided between the device unit and the bottom face of the recess part, and wherein the resin member does not extend between the primary face of the device unit and the bottom face.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

An electronic component and a method of manufacturing the same according to a first embodiment of the present invention will be described with reference to FIG. 1A to FIG. 5F.

Figure 1A:
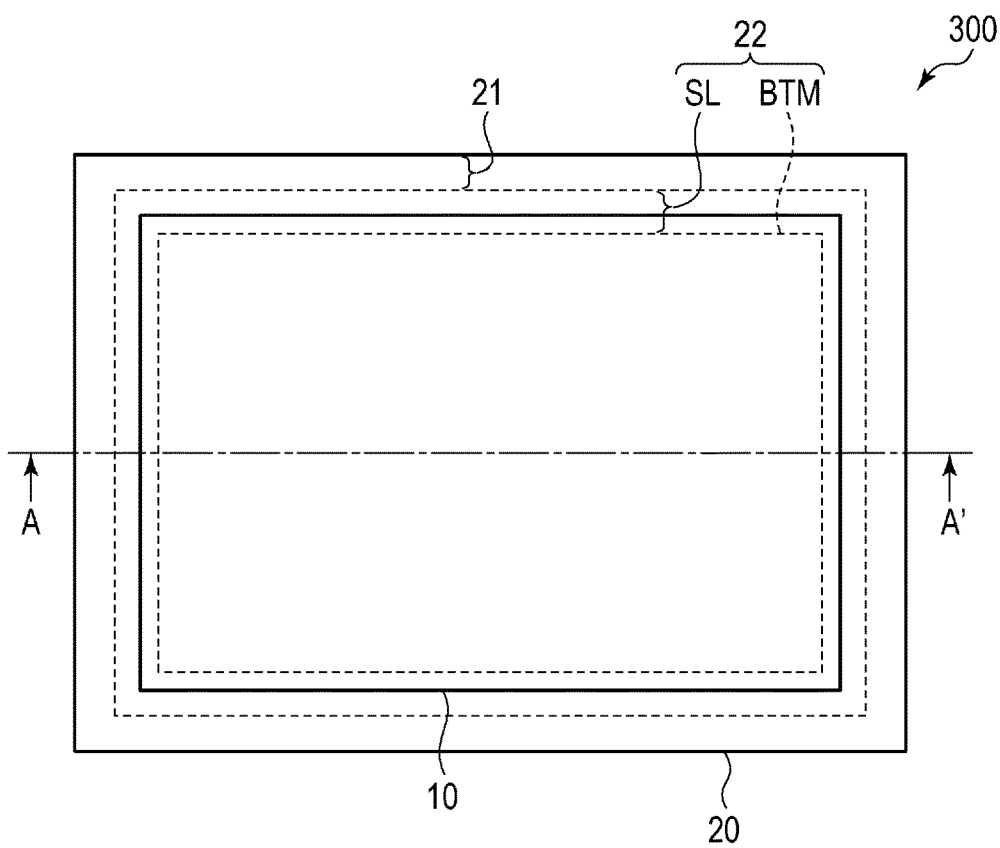
FIG. 1A is a plan view illustrating a general configuration of an electronic component according to a first embodiment of the present invention.
Figure 1B:
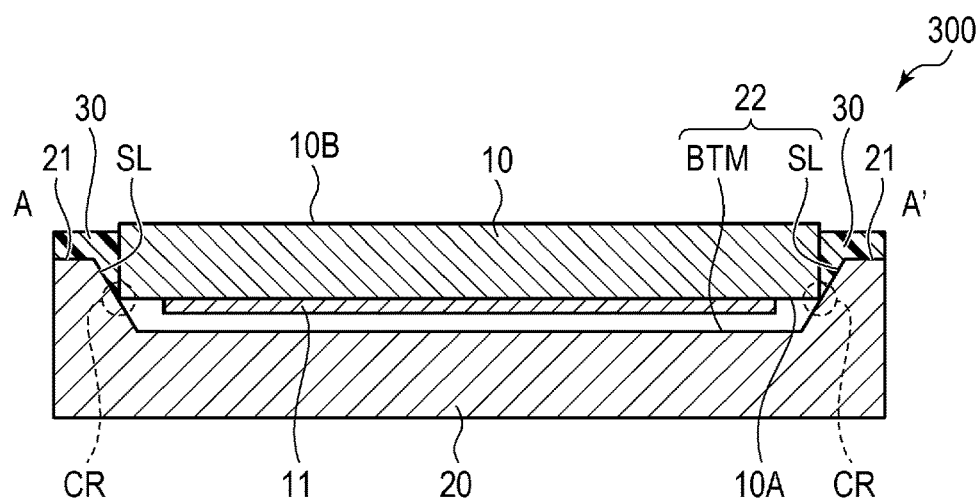
FIG. 1B is a cross-sectional view illustrating the general configuration of the electronic component according to the first embodiment of the present invention.
Figure 2A:
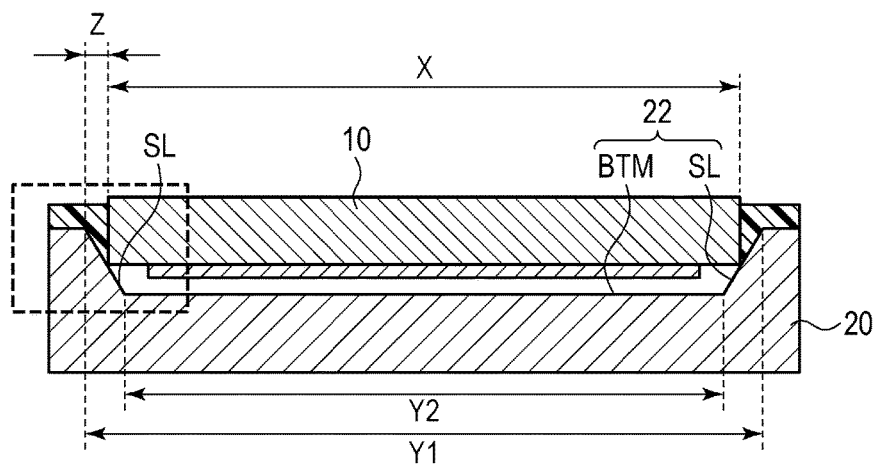
FIG. 2A, FIG. 2B and FIG. 2C are cross-sectional views illustrating the specific structure of the electronic component according to the first embodiment of the present invention.
Figure 2B:
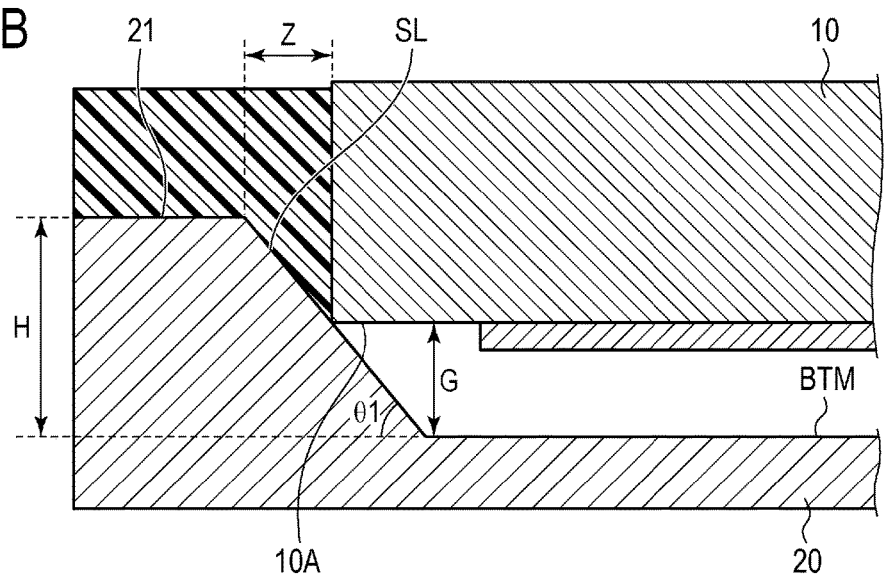
Figure 2C:
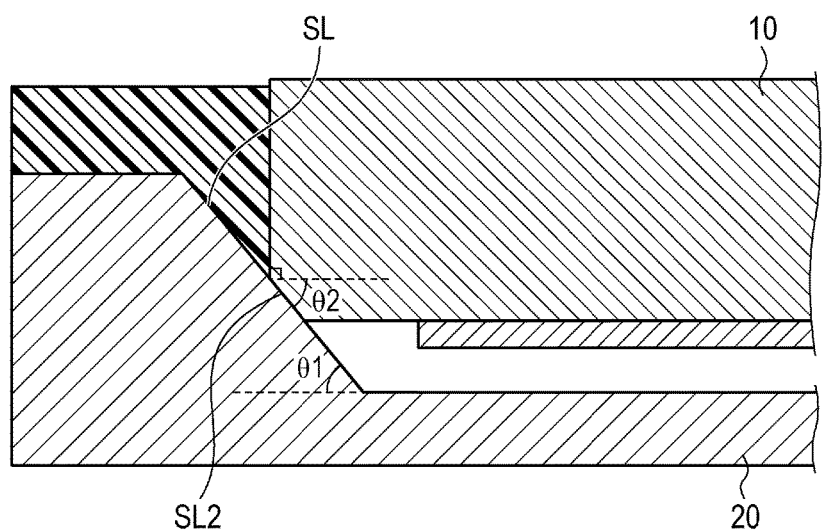
Figure 3A:
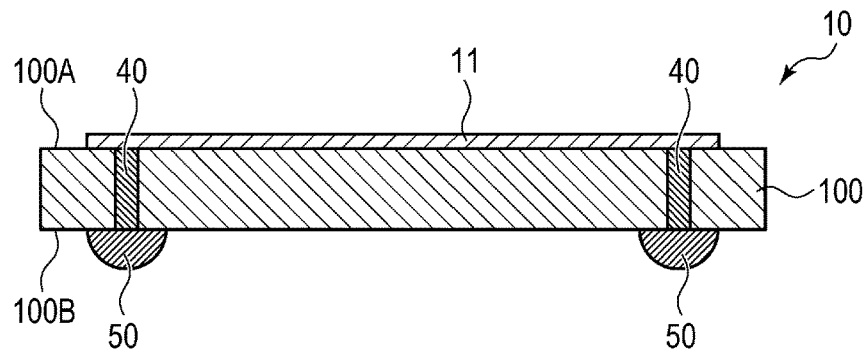
FIG. 3A, FIG. 3B and FIG. 3C are schematic cross-sectional views illustrating configuration examples of a device unit in the electronic component according to the first embodiment of the present invention.
Figure 3B:
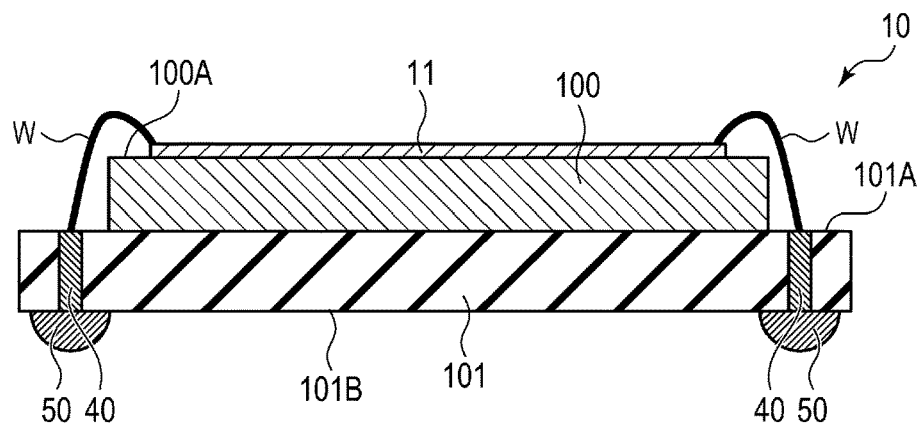
Figure 3C:
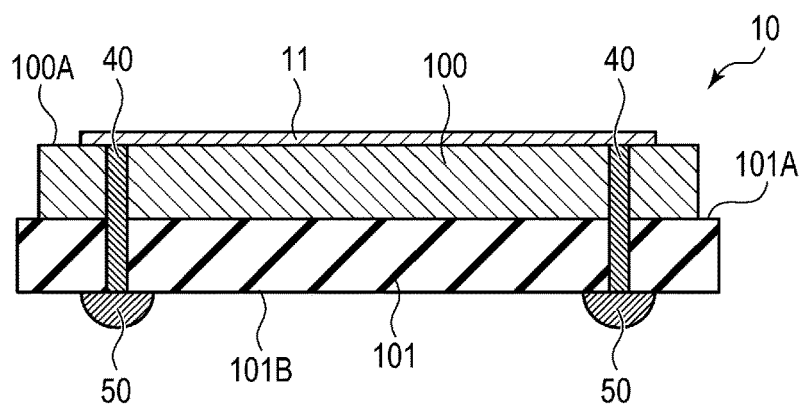

FIG. 1A is a plan view illustrating a general configuration of the electronic component according to the present embodiment. FIG. 1B is a cross-sectional view illustrating the general configuration of the electronic component according to the present embodiment. FIG. 2A to FIG. 2C are cross-sectional views illustrating the specific structure of the electronic component according to the present embodiment. FIG. 3A to FIG. 3C are schematic cross-sectional views illustrating configuration examples of a device unit in the electronic component according to the present embodiment. FIG. 4A to FIG. 5F are process cross-sectional views illustrating a method of manufacturing the electronic component according to the present embodiment.

First, a general configuration of the electronic component of the present embodiment will be described by using FIG. 1A and FIG. 1B. FIG. 1A is a top view illustrating the structure of the electronic component of the present embodiment. FIG. 1B is a schematic cross-sectional view taken along the line A-A' of FIG. 1A.

An electronic component 300 according to the present embodiment includes a device unit 10 and a support member 20. The device unit 10 is substantially a flat-plate structure having a first primary face 10A and a second primary face 10B opposed to each other and can be called also a semiconductor unit. A semiconductor element 11 is provided on the first primary face 10A of the device unit 10. The semiconductor element 11 may be provided on the second primary face 10B of the device unit 10. The support member 20 is substantially a flat-plate structure, and an upper flat face 21 and a recess part 22 recessed with respect to the upper flat face 21 are provided on one of the primary faces (the upper side in FIG. 1B). The recess part 22 has a slope face SL. In an example, the recess part 22 includes a bottom face BTM including the bottom thereof and a slope face inclined relative to the bottom face BTM, and the opening width thereof decreases as approaching the bottom face BTM.

As illustrated in FIG. 1B, the device unit 10 is fixed to the support member 20 so that the first primary face 10A faces the recess part 22 of the support member 20. The circumference of the first primary face 10A of the device unit 10 is in contact with the slope face SL that is the side face of the recess part 22 of the support member 20. More specifically, a boundary region (corner (ridge) CR) between the first primary face 10A and the end face of the device unit 10 is in contact with the slope face SL of the recess part 22 of the support member 20. In other words, the end face of the device unit 10 overlaps with the slope face SL of the recess part 22 of the support member 20 in a direction perpendicular to the first primary face 10A of the device unit 10. The bottom face BTM of the recess part 22 is parallel to the first primary face 10A of the device unit 10, and the slope face SL of the recess part 22 is inclined relative to the first primary face 10A of the device unit 10. Note that the end face of the device unit 10 refers to the side face of the device unit 10 that crosses to the first primary face 10A and the second primary face 10B.

The slope face SL of the recess part 22 is not necessarily required to be a plane whose angle of inclination relative to the bottom face BTM is constant, and may be a curved shape that is continuous over the bottom face BTM, for example. Further, the side face of the recess part 22 is not necessarily required to be the slope face SL formed of a single plane or a curved surface, and may be a shape formed of a plurality of surfaces, for example, a step-like shape, or the like. When the slope face SL has different shapes in respective side faces of the recess part 22, however, the device unit 10 may be arranged obliquely to the recess part 22, and it is thus desirable for the slope face SL to have the same shape in the entire side face of the recess part 22.

A resin member 30 is provided between the end face of the device unit 10 and the slope face SL of the recess part 22. As illustrated in FIG. 1B, the resin member 30 may be provided extending over the upper flat faces 21 of the support member 20. A void is provided between the first primary face 10A of the device unit 10 and the bottom face BTM of the recess part 22. This void is covered with the device unit 10, and the resin member 30 does not leak into a space between the first primary face 10A of the device unit 10 and the bottom face BTM of the recess part 22. That is, the resin member 30 does not extend to the space between the first primary face 10A of the device unit 10 and the bottom face BTM of the recess part 22.

Next, the relationship between the device unit 10 and the recess part 22 of the support member 20 will be described more specifically by using FIG. 2A to FIG. 2C. Note that, while FIG. 2A to FIG. 2C are cross-sectional views taken along the line A-A' of FIG. 1A, for example, the same relationship as described below applies to the cross-sectional view in a direction orthogonal to the line A-A'.

FIG. 2A is a schematic cross-sectional views when the device unit 10 having a width of X is arranged in the recess part 22 having an opening width of Y1 in the upper flat face 21 and an opening width of Y2 in the bottom face BTM of the support member 20. In this case, the width X, the opening width Y1, and the opening width Y2 of the device unit 10 have a relationship of Y2<X<Y1. That is, the opening width of the recess part 22 is narrower than the width of the device unit 10 at the bottom face BTM and wider than the width of the device unit 10 in a part away from the bottom face BTM. In other words, on the side of the bottom of the recess part 22 from the first primary face 10A of the device unit 10, the opening width of the recess part 22 is narrower than the width of the device unit 10. Further, on the opposite side of the first primary face 10A of the device unit 10 from the bottom of the recess part 22, the opening width of the recess part 22 is wider than the width of the device unit 10. When the shape of the slope face SL is the same on both side faces of the recess part 22, the device unit 10 and the recess part 22 are arranged so that the centers thereof are matched, and thus the distance Z between the end face of the device unit 10 and the upper end of the recess part 22 will be $Z=(Y1-X)/2$.

FIG. 2B is an enlarged view of a portion surrounded by a dotted line of FIG. 2A. When the depth of the recess part 22 from the upper flat face 21 is denoted as H and the angle of inclination of the slope face SL is denoted as $\theta 1$, a gap G between the first primary face 10A of the device unit 10 and the bottom face BTM is expressed as equation (1).

$$G=H-Z\times\tan\theta 1=H-(Y1-X)\times\tan\theta\tfrac{1}{2} \quad (1)$$

That is, the gap G between the first primary face 10A of the device unit 10 and the bottom face BTM is uniquely determined by the width X of the device unit 10, the opening width Y1 of the recess part 22, and the angle of inclination $\theta 1$. Therefore, for example, even when a single device unit 10 is arranged in each recess part 22 in the support member 20 provided with the plurality of recess parts 22, it is possible to have the same gap G between each device unit 10 and each recess part 22.

For example, when the angle of inclination $\theta 1$ is 60 degrees, the depth H of the recess part 22 is 100 μm, the width X of the device unit 10 is 10 mm, and the opening width Y1 of the recess part 22 is 10.08 mm, the gap G will be 30.7 μm in accordance with equation (1). In this case, when the opening width Y1 of the recess part 22 varies by ±1 μm due to a dimensional accuracy when machining the recess part 22, the gap G will vary by around ±0.87 μm. Further, when the angle of inclination $\theta 1$ varies by +1 degree (that is, $\theta 1$=61 degrees), the gap G will be 27.84 μm, and the amount of variation of the gap G will be 2.88 μm.

When the device unit 10 is a solid-state imaging device, it is general to provide the gap G of approximately several tens μm between the solid-state imaging device and the support member so that a contamination attached to the support member 20 is not captured on the imaging element. Therefore, such a degree of the amount of gap variation as described above does not affect the characteristics of the solid-state imaging device.

The boundary region (corner CR) between the first primary face 10A and the end face of the device unit 10 may have a chamfer structure provided with a slope surface SL2 inclined relative to the first primary face 10A and the end face of the device unit 10 as illustrated in FIG. 2C, for example. In the case of the structure as illustrated in FIG. 2B in which the corner CR of the device unit 10 is not chamfered, a stress is concentrated at the apex of the corner CR, and damage such as chipping may occur in the device unit 10. With the slope face SL2 being provided in the boundary region, an area contacting with the support member 20 increases, and thereby a stress concentrated in the boundary region can be mitigated, which can suppress occurrence of damage in the device unit 10. In this case, it is preferable that the angle of inclination θ1 of the slope face SL of the support member 20 be equal to the angle of inclination θ2 of the slope face SL2 of the device unit 10.

The device unit 10 is not limited in particular, and various structure as illustrated in FIG. 3A to FIG. 3C may be applied, for example. Note that, in the following description, the first primary face of each substrate is assumed to correspond to a face on the first primary face 10A side of the device unit 10. Further, the second primary face of each substrate is assumed to correspond to a face on the second primary face 10B side of the device unit 10.

The device unit 10 illustrated in FIG. 3A includes a semiconductor element 11 arranged on a first primary face 100A side of the semiconductor substrate 100 and an external connection terminal 50 arranged on a second primary face 100B side of the semiconductor substrate 100. The semiconductor element 11 and the external connection terminal 50 are electrically connected via through electrodes 40 provided so as to penetrate the semiconductor substrate 100.

The device unit 10 illustrated in FIG. 3B includes a semiconductor substrate 100 and a mounting substrate 101 mounting the semiconductor substrate 100 thereon. The semiconductor element 11 is arranged on a first primary face 100A side of the semiconductor substrate 100, and the external connection terminal 50 is arranged on a second primary face 101B side of the mounting substrate 101. The semiconductor element 11 and the external connection terminal 50 are electrically connected via wires W and the through electrodes 40 provided so as to penetrate the mounting substrate 101.

The device unit 10 illustrated in FIG. 3C includes a mounting substrate 101 and the semiconductor substrate 100 arranged on the mounting substrate 101. The semiconductor element 11 is arranged on the first primary face 100A side of the semiconductor substrate 100, and the external connection terminal 50 is arranged on the second primary face 101B side of the mounting substrate 101. The semiconductor element 11 and the external connection terminal 50 are electrically connected via through electrodes 40 provided so as to penetrate the semiconductor substrate 100 and the mounting substrate 101.

In the configuration having the mounting substrate 101 as illustrated in FIG. 3B and FIG. 3C, it is desirable that the boundary region of the device unit 10 placed on the slope face SL of the recess part 22 of the support member 20 be the boundary region between the first primary face 101A and the end of the mounting substrate 101.

While the case where the device unit 10 is formed of a single substrate and the case where the device unit 10 is formed of two stacked substrates have been exemplified here, the similar form may be applied to the case where the device unit 10 is formed of three or more stacked substrates.

Next, a method of manufacturing the electronic component according to the present embodiment will be described by using FIG. 4A to FIG. 5F. Note that some known semiconductor manufacturing process may be used for the manufacturing of the electronic component. Further, although the description will be omitted here, other steps, for example, a heat treatment process step, a cleaning process step, or the like may be performed between respective steps described later, if necessary.

Figure 4A:
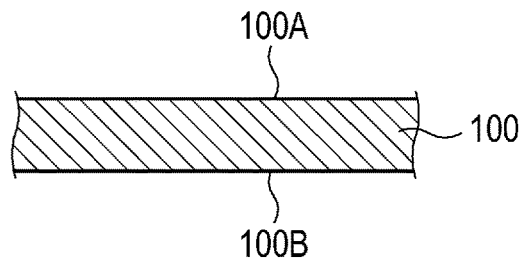
FIG. 4A, FIG. 4B and FIG. 4C, and FIG. 5A, FIG. 5B, FIG. 5C, FIG. 5D, FIG. 5E and FIG. 5F are process cross-sectional views illustrating a method of manufacturing the electronic component according to the first embodiment of the present invention.

First, the semiconductor substrate 100 having the first primary face 100A and the second primary face 100B opposed to each other is prepared (FIG. 4A). The semiconductor substrate 100 can be properly selected in accordance with the semiconductor element 11 to be formed. For example, a silicon substrate, a GaAs substrate, or the like may be used for the semiconductor substrate 100. In this example, a silicon substrate with a thickness of 725 μm is used as the semiconductor substrate 100.

Figure 4B:
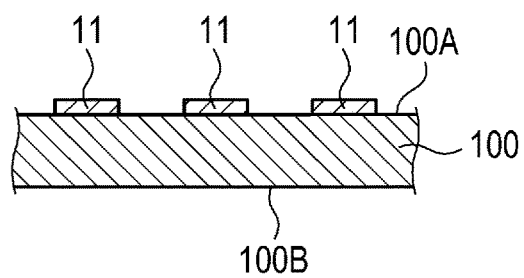

Next, the semiconductor elements 11 are formed on the first primary face 100A side (the upper side in FIG. 4A and FIG. 4B) of the semiconductor substrate 100 (FIG. 4B). Note that, although the depiction is omitted here, other than a transistor or a diode, each of the semiconductor elements 11 includes necessary components such as an element isolation film, an interconnection layer, an interlayer insulating film, or the like for implementing a predetermined function of the device unit 10. A plurality of semiconductor elements 11 are formed on the semiconductor substrate 100, and inspection of electric characteristics or the like of each of the semiconductor elements 11 is performed after completion.

Figure 4C:
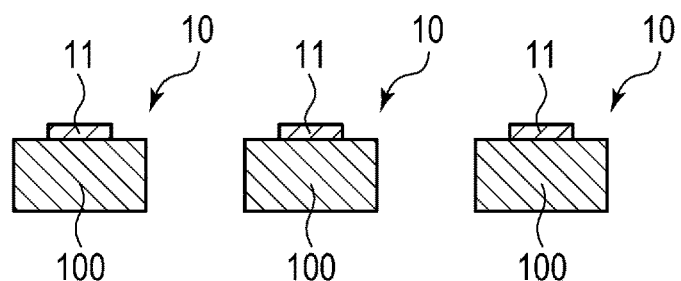

Next, the semiconductor substrate 100 on which the plurality of semiconductor elements 11 are provided is singulated into respective formation regions of the semiconductor elements 11, and the plurality of device units 10 are formed (FIG. 4C). A method such as blade dicing, laser dicing, plasma dicing, or the like can be used for singulation of the semiconductor substrate 100. As described above, since the accuracy of the gap G depends on the dimensional machining-accuracy, it is preferable to use a method superior in the dimensional machining-accuracy, for example, plasma dicing for singulation of the semiconductor substrate 100.

Further, other than the semiconductor substrate 100, a support member 200 having a first primary face 200A and a second primary face 200B opposed to each other is prepared. The support member 200 is not limited in particular, and a glass substrate, a silicon substrate, or the like can be applied, for example. In this example, a quartz glass substrate with a thickness of 500 μm is used as the support member 200.

Figure 5A:
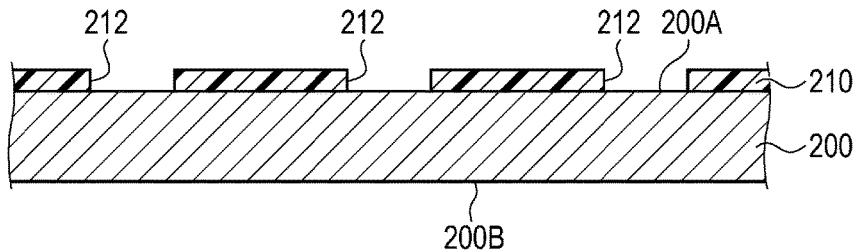

Next, a mask 210 having openings 212 in regions where the recess parts 22 are to be formed are formed on the first primary face 200A (upper side in FIG. 5A) of the support member 200 (FIG. 5A). For example, a novolak-based positive-type photoresist can be used for the mask 210. In this case, by patterning a photoresist film by photolithography, the mask 210 having the openings 212 can be formed. The mask 210 may be a hard mask on which a pattern of a photoresist film is copied.

Figure 5B:
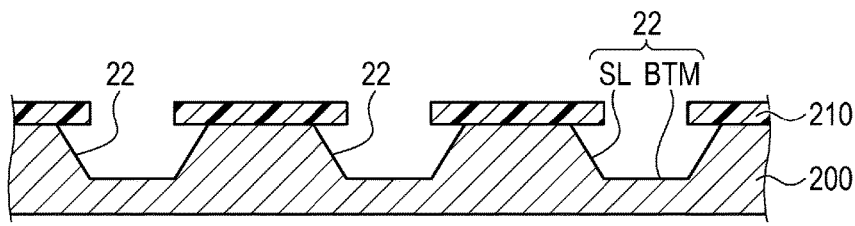

Next, the support member 200 is etched by using the mask 210 as a mask, and the recess parts 22 each including the slope face SL and the bottom face BTM are formed on the first primary face 200A side of the support member 200 (FIG. 5B). Etching for forming the recess parts 22 is not limited in particular as long as it can form the slope faces SL, and may be wet etching or dry etching. Alternatively, both wet etching and dry etching may be used together. In terms of shorter processing time, wet etching, which is featured in a high etching rate, is preferable. Note that, for example, wet etching using hydrofluoric acid is applicable to wet etching of a quartz glass substrate. Since etching proceeds in an isotropic manner in general wet etching, side-etching occurs at the end of the mask 210, which causes each of the recess parts 22 to have a shape with the slope face SL and the bottom face BTM as illustrated in FIG. 5B. In this example, wet etching is performed until the recess part 22 reaches 100 μm in depth.

Figure 5C:
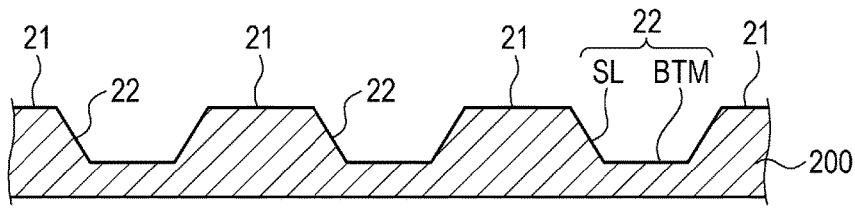

Next, the mask 210 used for formation of the recess parts 22 is removed (FIG. 5C). When the mask 210 is formed by photoresist, the mask 210 can be removed by a wet process using organic dissociation solution such as tetramethylammonium hydroxide (TMAH) or the like, a plasma asking process, or the like.

In such a way, a plurality of recess parts 22 are formed in the support member 200. Note that portions in which the recess parts 22 are not formed in the first primary face 200A of the support member 200 correspond to the above-described upper flat face 21.

Figure 5D:
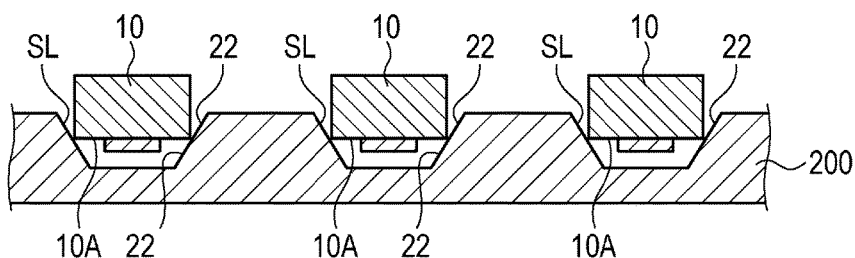

Next, the device units 10 formed in the step of FIG. 4C are placed to the plurality of recess parts 22 provided in the support member 200, respectively (FIG. 5D). Each of the device units 10 is placed so that the first primary face 10A thereof faces the recess part 22 of the support member 200. When inspection of the electric characteristics or the like has been performed in the formation step of the device units 10, it is preferable to place only the device units 10 which have passed the inspection to the support member 200 for improving the yield of the electronic components. At this time, since each device unit 10 is in a state of being supported by the four slope faces SL of each recess part 22 of the support member 200, this suppresses displacement of the device unit 10 or suppresses the device unit 10 from getting out of the recess part 22 in transport after placement.

Figure 5E:
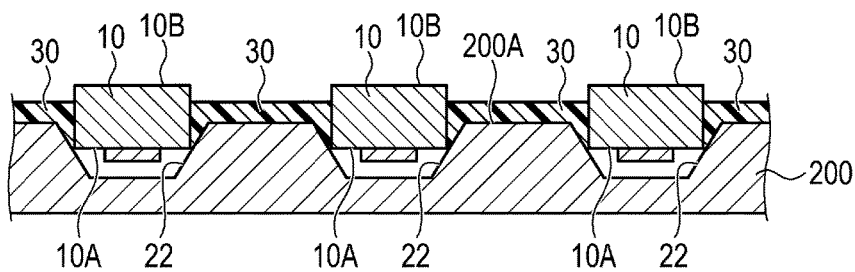

Next, after the resin member 30 is applied to respective regions between the device units 10 on the first primary face 200A side of the support member 200 by a method such as a dispense method or a printing method, the resin member 30 is cured by means of heating, UV irradiation, or the like (FIG. 5E). Thereby, the device units 10 are adhered and fixed to the support member 200. At this time, since the device unit 10 is in contact with the slope face SL of the recess part 22, this can suppress inflow of the resin member 30 into a space surrounded by the first primary face 10A of the device unit 10 and the recess part 22 of the support member 20.

After the device units 10 are placed in the recess parts 22 of the support member 200, it is further preferable to move it to an environment in a higher pressure than the atmospheric pressure and then apply the resin member 30 under this environment. By doing so, the pressure on the second primary face 10B side of the device unit 10 is higher than the pressure inside the space between the device units 10 and the support member 200, and this pressure difference causes the device units 10 to be pressed against the support member 200. This results in a state where the device units and the slop faces SL of the recess parts 22 are in contact with each other in a more reliable manner. The resin member 30 is applied and cured in this state, which can further suppress inflow of the resin member 30 into the space surrounded by the first primary face 10A of the device unit 10 and the recess part 22 of the support member 200.

When the device unit 10 and the slope face SL of the recess part 22 are not completely in contact with each other and there is a slight gap therebetween, the resin member 30 may infiltrate from the gap by capillary phenomenon. With the configuration of the present embodiment described above being applied, however, leakage of the resin member 30 into the first primary face 10A of the device unit 10 and the bottom face BTM of the recess part 22 can be suppressed.

Note that, while the resin member 30 is formed only between the device units 10 in this example, the resin member 30 may be formed on the entire surface so as to bury the second primary faces 10B of the device units 10.

Figure 5F:
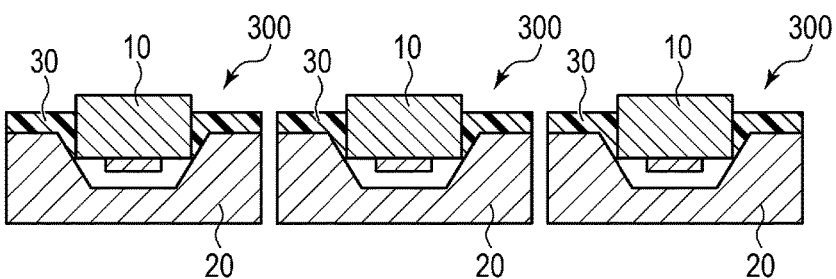

Next, the support member 200 and the resin member 30 are cut and singulated by means of blade dicing or the like to complete the electronic component 300 according to the present embodiment (FIG. 5F). Each of the singulated support members 200 is the support member 20 in FIG. 1A, FIG. 1B, and the like.

A use of the manufacturing method of the present embodiment can suppress the resin member 30 from leaking into the first primary face 10A of the device unit 10 and the bottom face BTM of the recess part 22 of the support member 20. Thereby, for example, when the device unit 10 is a solid state imaging device and a photoelectric conversion element is arranged on the first primary face 10A side, a wider effective pixel area of the photoelectric conversion element can be arranged.

In such a way, according to the present embodiment, leakage of the resin member 30 into the first primary face 10A of the device unit 10 or the bottom face BTM of the recess part 22 of the support member 20 can be suppressed, and the effective element area of the semiconductor element 11 can be increased. From a point of view for maintaining the same effective element area, being able to suppress leakage of the resin member 30 means that reduction in size of an electronic component is possible.

Second Embodiment

Figure 6:
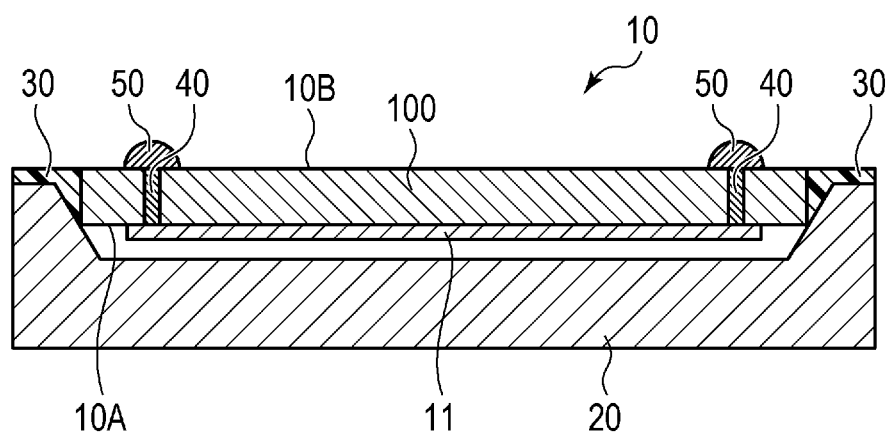
FIG. 6 is a schematic cross-sectional view illustrating the structure of an electronic component according to a second embodiment of the present invention.
Figure 7A:
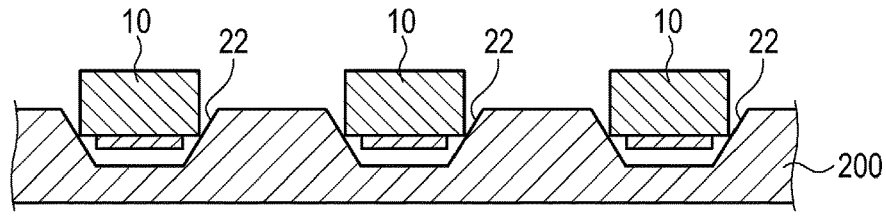
FIG. 7A, FIG. 7B, FIG. 7C, FIG. 7D and FIG. 7E are process cross-sectional views illustrating a method of manufacturing the electronic component according to the second embodiment of the present invention.
Figure 7B:
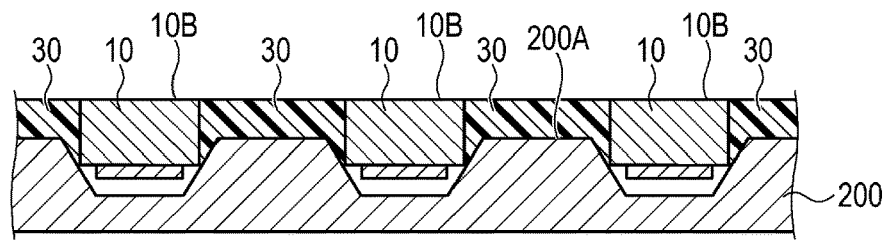
Figure 7C:
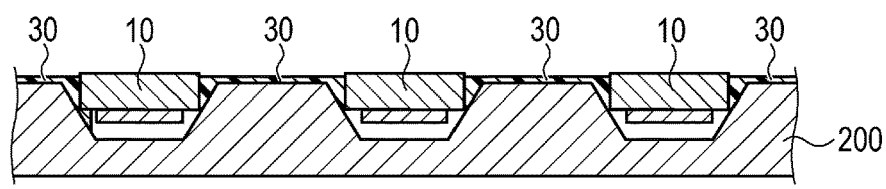

An electronic component and a method of manufacturing the same according to a second embodiment of the present invention will be described with reference to FIG. 6 to FIG. 7E. FIG. 6 is a schematic cross-sectional view illustrating the structure of the electronic component of the present embodiment. FIG. 7A to FIG. 7E are process cross-sectional views illustrating the method of manufacturing the electronic component according to the present embodiment. Similar components to those of the electronic component according to the first embodiment are labeled with the same reference symbol, and the description thereof will be omitted or simplified.

As illustrated in FIG. 6, an electronic component 300 according to the present embodiment is an electronic component in which the device unit 10 having the structure illustrated in FIG. 3A is applied as the device unit 10. That is, in the semiconductor substrate 100 of the device unit 10, the through electrodes 40 are provided through from the first primary face 10A to the second primary face 10B. Further, the semiconductor element 11 provided on the first primary face 10A side and the external connection terminal provided on the second primary face 10B side are electrically connected via the through electrodes 40. Other features are the same as those of the electronic component according to the first embodiment.

Note that, in the electronic component according to the present embodiment, the second primary face 10B of the device unit 10 protrudes above the upper flat face 21 of the support member 20, it is possible to directly connect the external connection terminal 50 to a circuit substrate or the like by flip-chip connection or the like, for example.

Next, the method of manufacturing the electronic component according to the present embodiment will be described by using FIG. 7A to FIG. 7E. First, the device units 10 are formed in the same manner as the method of manufacturing the electronic component according to the first embodiment illustrated in FIG. 4A to FIG. 4C. Further, a plurality of recess parts 22 are formed in the support member 200 in the same manner as the method of manufacturing the electronic components according to the first embodiment illustrated in FIG. 5A to FIG. 5C.

Next, the formed device units 10 are placed in the plurality of recess parts 22 provided in the support member 200, respectively (FIG. 7A), in the same manner as the method of manufacturing the electronic components according to the first embodiment.

Next, the resin member 30 is formed in at least regions between device units 10, and the support members 20 and the device units 10 are adhered to each other (FIG. 7B) in the same manner as the method of manufacturing the electronic components according to the first embodiment.

Next, the device units 10 are grinded from the second primary faces 10B side (back grind) to thin the device units 10, if necessary. At this time, since the resin member 30 is also grinded together with the device units 10, the second primary faces 10B of the device units 10 and the surface of the resin member 30 are substantially flat (FIG. 7C). In this example, grinding is performed until the thickness of the device unit 10 becomes 150 μm, for example. Note that thinning the device units 10 allows for advantages such as easier formation of the through electrode 40 and the like.

Figure 7D:
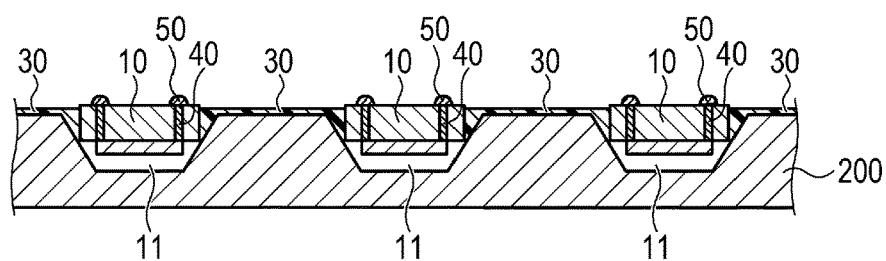
Figure 7E:
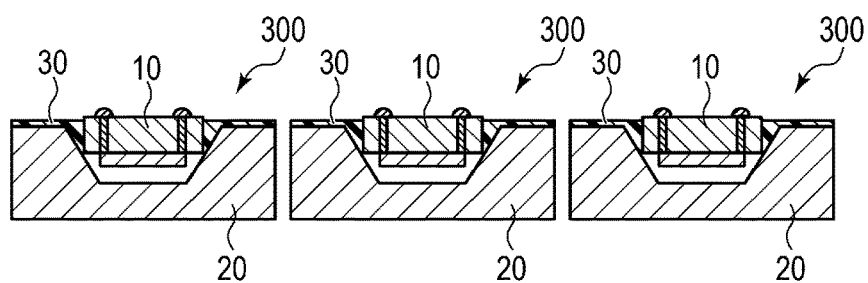

Next, the through electrodes 40, which reach interconnections provided from the second primary faces 10B to the first primary faces 10A and are electrically connected to each of the semiconductor elements 11, and the external connection terminals 50, which are electrically connected to the through electrodes 40, are formed in and on each of the device units 10 (FIG. 7D). The through electrode 40 can be formed by forming, in the semiconductor substrate 100, a through via (TSV) reaching an electrode part (not shown) arranged on the first primary face 10A side and then filling this through via with a conductive member. When the semiconductor substrate 100 is a silicon substrate, a so-called Bosch method can be used to form a through via. Copper (Cu), gold (Au), or the like can be used as a conductive member filled in the through via. A method such as electroplating can be applied to fill these conductive members in the through via. The external connection terminal 50 can be formed by mounting a solder ball on the through electrode 40 via flux (not illustrated) and then reflowing the solder ball at a temperature around 250 degrees Celsius, for example.

Next, the support member 200 and the resin member 30 are cut and singulated by means of blade dicing or the like to complete the electronic component 300 according to the present embodiment (FIG. 7E).

As discussed above, even when the through electrode 40 is provided in the device unit 10, the manufacturing method of the present invention can be used, which can suppress the resin member 30 from extending to the first primary face 10A of the device unit 10 and the bottom face BTM of the recess part 22 of the support member 200. Thereby, for example, when the device unit 10 is a solid state imaging device and a photoelectric conversion element is arranged on the first primary face 10A side, a wider effective pixel area of the photoelectric conversion element can be arranged.

In such a way, according to the present embodiment, leakage of the resin member 30 to the first primary face 10A of the device unit 10 or the bottom face BTM of the recess part 22 of the support member 20 can be suppressed also when the through electrode 40 is provided in the device unit 10. This can increase the effective element area of the semiconductor element 11.

Third Embodiment

Figure 8A:
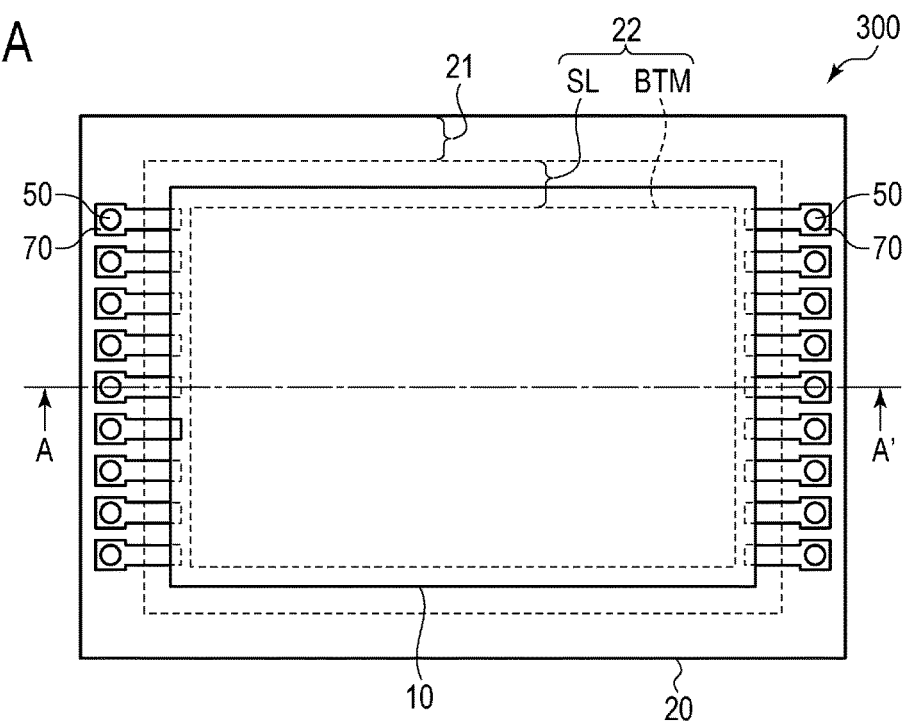
FIG. 8A is a cross-sectional view illustrating the structure of an electronic component according to a third embodiment of the present invention.
Figure 8B:
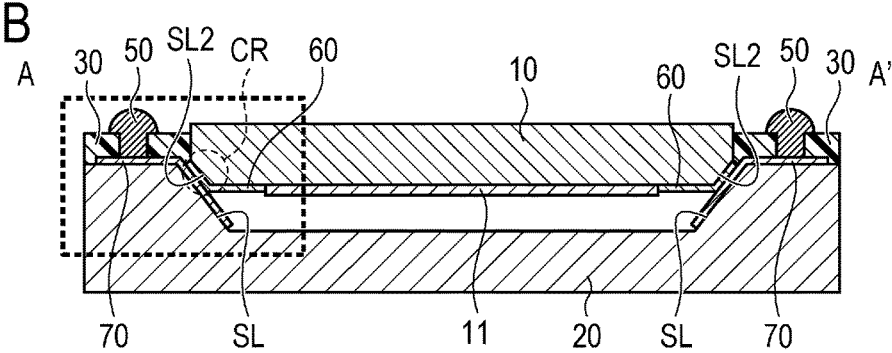
FIG. 8B and FIG. 8C are cross-sectional views illustrating the structure of the electronic component according to the third embodiment of the present invention.
Figure 8C:
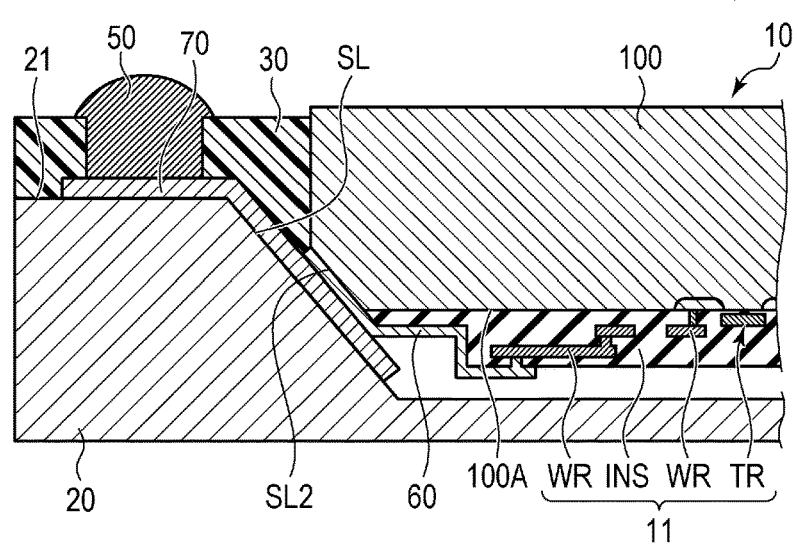

An electronic component and a method of manufacturing the same according to a third embodiment of the present invention will be described by using FIG. 8A to FIG. 10F. FIG. 8A is a plan view illustrating the structure of the electronic component according to the present embodiment. FIG. 8B and FIG. 8C are schematic cross-sectional views illustrating the structure of the electronic component according to the present embodiment. FIG. 9A to FIG. 10F are process cross-sectional views illustrating a method of manufacturing the electronic component according to the present embodiment. Similar components to those of the electronic component according to the first and second embodiments are labeled with the same reference symbol, and the description thereof will be omitted or simplified.

First, the structure of the electronic component according to the present embodiment will be described by using FIG. 8A to FIG. 8C. FIG. 8A is a top view illustrating the structure of the electronic component according to the present embodiment. FIG. 8B is a schematic cross-sectional view taken along a line A-A' of FIG. 8A. FIG. 8C is an enlarged view of a portion surrounded by a dotted line of FIG. 8B.

The electronic component 300 according to the present embodiment is common to the first and second embodiment in that the electronic component 300 has the device unit 10 and the support member 20. On the other hand, the electronic component 300 according to the present embodiment is different from the electronic components according to the first and second embodiments in the following points. The first point is that, as illustrated in FIG. 8A and FIG. 8B, an interconnection layer 70 (first interconnection layer) that extends from the slope face SL of the recess part 22 to a face (upper flat face 21) outside the recess part and is electrically connected to the external connection terminal 50 is provided on the support member 20. The second point is that, as illustrated in FIG. 8B, the corner CR of the first primary face 10A side of the device unit 10 is chamfered and a slope face SL2 is provided, and an interconnection layer 60 (second interconnection layer) electrically connected to the semiconductor element 11 is arranged on the slope face SL2. The interconnection layer and the interconnection layer 70 are electrically connected to each other in a portion where the slope face SL faces the slope face SL2.

The interconnection layer 70 is arranged from the slope face SL of the recess part 22 of the support member 20 to the upper flat face 21 of the support member 20, as illustrated in FIG. 8A. The external connection terminal 50 is electrically connected to the interconnection layer 70 via an opening provided in the resin member 30 above the upper flat face 21, as illustrated in FIG. 8B.

FIG. 8C illustrates, a transistor TR provided on the first primary face 100A side of the semiconductor substrate 100, multi-level interconnection layers WR, an insulating layer INS arranged between the transistor TR and one interconnection layer WR and between one interconnection layer WR and another interconnection layer WR, as an example of the semiconductor element 11. The interconnection layer 60 provided extending from the slope face SL2 of the device unit 10 is electrically connected to the interconnection layer WR via a via hole provided in the insulating layer INS.

When the device unit 10 is arranged in the recess part 22 of the support member 20, the interconnection layer 60 and the interconnection layer 70 come into contact with each other and are electrically connected. Furthermore, the external connection terminal 50 and the interconnection layer 60 are electrically connected to each other by the interconnection layer 70 arranged on the support member 20 and, as a result, the external connection terminal 50 and the semiconductor element 11 are electrically connected to each other.

With the structure described above, it is possible to electrically connect an external power source (not illustrated) to the semiconductor element 11 via the external connection terminal 50, the interconnection layer 70, and the interconnection layer 60, without providing the through electrode 40 as illustrated in the second embodiment. Further, in the same manner as the cases of the first and second embodiments, it is possible to suppress the resin member 30 from extending to the first primary face 10A of the device unit 10 and the bottom face BTM of the recess part 22 of the support member 200. Thereby, for example, when the device unit 10 is a solid state imaging device and a photoelectric conversion element is arranged on the first primary face 10A side, a wider effective pixel area of the photoelectric conversion element can be arranged.

Next, the method of manufacturing the electronic component according to the present embodiment will be described by using FIG. 9A to FIG. 10F.

First, the semiconductor elements 11 are formed on the first primary face 100A side of the semiconductor substrate 100 (FIG. 9A) in the same manner as the method of manufacturing the electronic component according to the first embodiment illustrated in FIG. 4A and FIG. 4B. Note that, when insulating films, interconnection layers, or the like forming the semiconductor elements 11 are arranged in a region (dicing region) to be divided and cut when the semiconductor substrate 100 is singulated in the subsequent step, they are removed by means of etching or the like to expose the semiconductor substrate 100 on the first primary face 100A side.

Figure 9A:
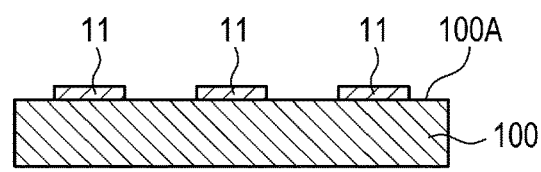
FIG. 9A, FIG. 9B, FIG. 9C and FIG. 9D, and FIG. 10A, FIG. 10B, FIG. 10C, FIG. 10D, FIG. 10E and FIG. 10F are process cross-sectional views illustrating a method of manufacturing the electronic component according to the third embodiment of the present invention.
Figure 9B:
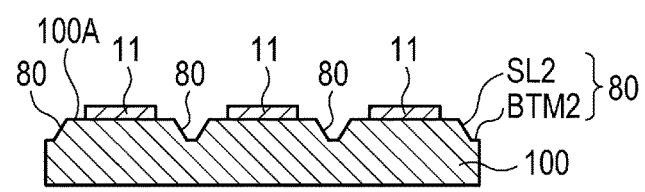

Next, grooves 80 each formed of the slope face SL2 and a bottom face BTM2 are formed in the dicing region on the first primary face 100A side of the semiconductor substrate 100 (FIG. 9B). Specifically, after a photoresist film (not illustrated) is formed on the first primary face 100A of the semiconductor substrate 100, the photoresist film is patterned by photolithography so as to expose the dicing region between the semiconductor elements 11. Next, the semiconductor substrate 100 is etched using the patterned photoresist film as a mask to form the grooves 80. In this example, the groove 80 whose slope angle θ2 of the slope face SL2 is 64 degrees and depth is 30 μm, for example, is formed by plasma etching using $SF_6$ as a process gas, for example.

Figure 9C:
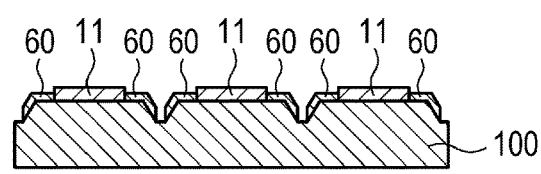

Next, the interconnection layers 60 each extending from the semiconductor element 11 to the slope face SL2 of the groove 80 are formed (FIG. 9C). In this process, by removing the interconnection layer 60 in the dicing region within the region of the groove 80 in advance, it is possible to suppress loading of the dicing blade or damage spreading to the interconnection layer 60 at dicing. Note that, although the depiction is omitted, an insulating film of silicon oxide or the like is formed between the semiconductor substrate 100 and the interconnection layer 60. Any conductive material such as a metal material such as aluminum or cupper or an oxide conductor such as ITO, IZO, or the like may be used for the material of the interconnection layer 60. In this example, the interconnection layer 60 is formed of an aluminum-based conductive material.

Figure 9D:
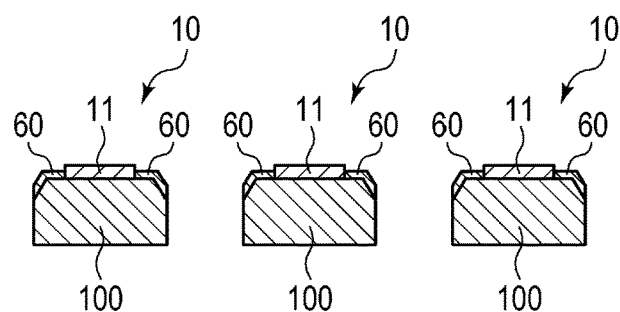

Next, the semiconductor substrate 100 on which a plurality of semiconductor elements 11 are provided is singulated into formation regions of the semiconductor elements 11 by plasma dicing, for example, to form a plurality of device units 10 (FIG. 9D). The plasma dicing is preferable because the semiconductor substrate 100 can be singulated without damage spreading to the interconnection layer 60. Specifically, after a photoresist film (not illustrated) is formed on the first primary face 100A of the semiconductor substrate 100, the photoresist film is patterned so as to expose only the bottom faces BTM2 of the grooves 80 by photolithography. Next, the semiconductor substrate 100 is etched using the patterned photoresist film as a mask to singulate the semiconductor substrate 100. For example, when the semiconductor substrate 100 is a silicon substrate, the semiconductor substrate 100 is processed in a vertical direction using a so-called Bosch method to singulate the semiconductor substrate 100.

Further, separately from the manufacturing of the device unit 10, the support member 200 in which a plurality of recess parts 22 are provided (FIG. 10A) is provided in the same manner as the method of manufacturing the electronic component according to the first embodiment illustrated in FIG. 5A to FIG. 5C.

Figure 10A:
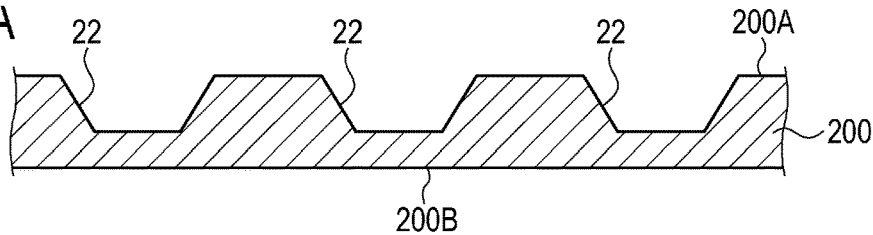
Figure 10B:
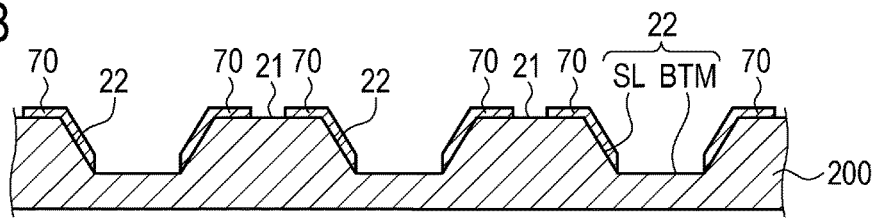
Figure 10C:
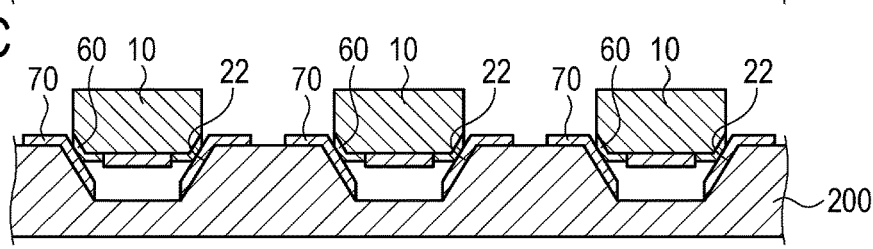

Next, the interconnection layer 70 extending from the upper flat face 21 to the slope face SL of the recess part 22 is formed on the first primary face 200A side of the support member 200 (FIG. 10B). A conductive material such as a metal material such as aluminum or cupper or an oxide conductor such as ITO, IZO, or the like may be used for the material of the interconnection layer 70. For example, after an aluminum film is deposited on the entire surface of the first primary face 200A of the support member 200, the interconnection layer 70 is formed by patterning this aluminum film using photolithography and dry etching.

Next, the formed device units 10 are placed in the plurality of recess parts 22 provided in the support member 200, respectively (FIG. 10C), in the same manner as the method of manufacturing the electronic component according to the first embodiment. This results in a state where the interconnection layer 60 provided on the device unit 10 and the interconnection layer 70 provided on the support member 200 are in contact with each other.

Figure 10D:
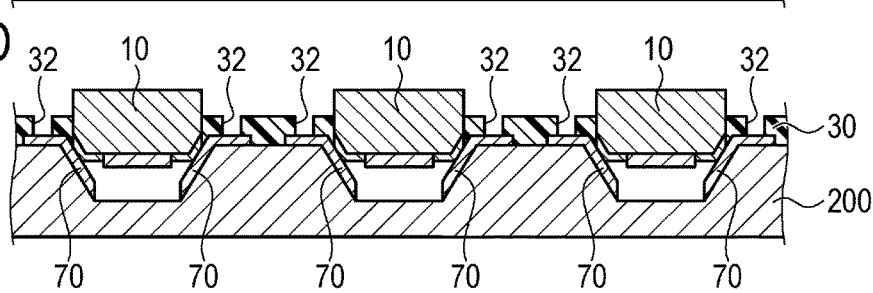

Next, the resin member 30 is formed in at least regions between device units 10, and the support members 20 and the device units 10 are adhered to each other in the same manner as the method of manufacturing the electronic components according to the first embodiment. Next, the openings 32 exposing the interconnection layer 70 on the upper flat faces 21 are formed in the resin member 30 (FIG. 10D). The resin member 30 can be applied by the same method as in the first embodiment. A photosensitive resin material can be applied to the resin member 30. In this example, a photosensitive polyimide is used as the resin member 30, and the resin member 30 is patterned by photolithography to form the openings 32.

Note that, after the resin member 30 is formed and before the opening 32 is formed, back grind may be applied to the device units 10 from the second primary face 10B side to thin the device units 10 in the same manner as the case of the second embodiment.

Figure 10E:
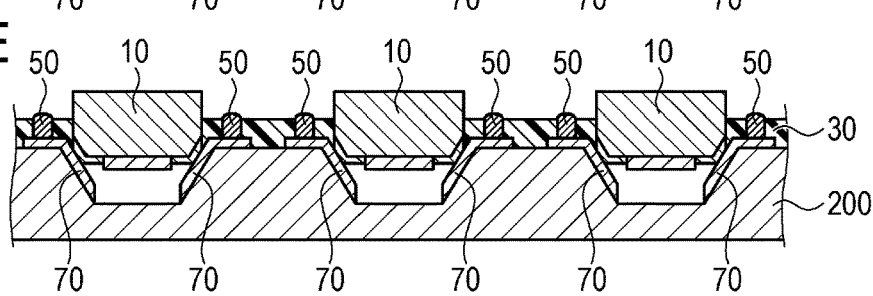

Next, the external connection terminals 50 electrically connected to the interconnection layer 70 are formed in the openings 32 of the resin member 30 (FIG. 10E). The external connection terminal 50 can be formed by mounting a solder ball in the opening 32 via flux (not illustrated) and then reflowing the solder ball at a temperature around 250 degrees Celsius, for example.

Note that, while the external connection terminal 50 is provided on the interconnection layer 70 of the upper flat face 21 in the present embodiment, another interconnection that connects the opening 32 to the second primary face 10B of the device unit 10 may be provided, and the external connection terminal 50 may be provided on the second primary face 10B of the device unit 10.

Figure 10F:
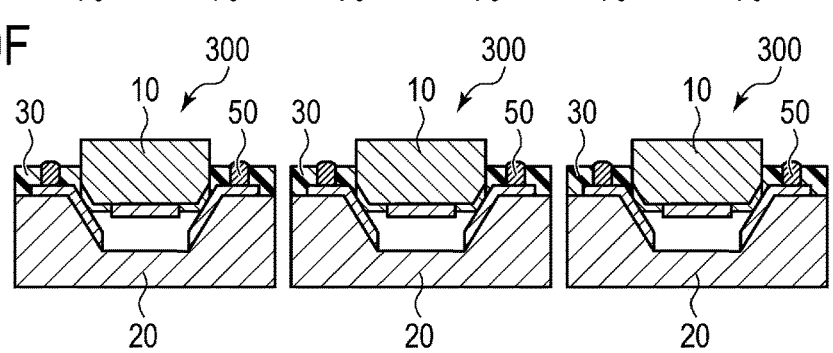

Next, the support member 200 and the resin member 30 are cut and singulated by means of blade dicing or the like to complete the electronic component 300 according to the present embodiment (FIG. 10F). Each of the singulated support members 200 is the support member 20 in FIG. 8A to FIG. 8C and the like.

As discussed above, in the electronic component of the present embodiment, it is possible to electrically connect an external power source and the semiconductor element 11 to each other without forming a through electrode. Further, in the electronic component of the present embodiment, since the slope face SL2 is provided on the corner CR of the device unit 10, it is possible to suppress damage such as chipping at the contact portion against the slope face SL of the recess part 22 of the support member 20. Since a gap on the contact surface between the device unit 10 and the support member 20 is less likely to occur, infiltration of the resin member 30 can be further suppressed. Thereby, for example, when the device unit 10 is a solid state imaging device and a photoelectric conversion element is arranged on the first primary face 10A side, a wider effective pixel area of the photoelectric conversion element can be arranged.

As described above, according to the present embodiment, easier electrical connection between the device unit 10 and the support member 20 can be obtained without providing a through electrode in the device unit 10. Further, occurrence of a defect such as chipping in the device unit 10 can be suppressed. Further, similarly to the first and second embodiments, the effective element area of the semiconductor element 11 can be increased.

Modified Embodiments

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment are an embodiment of the present invention. For example, in the electronic component according to the third embodiment described above, the through electrode 40 similar to that of the second embodiment may be further provided.

Further, in the embodiments described above, while the solid state imaging device is illustrated as an example of the semiconductor element 11, the semiconductor element 11 provided to the device unit 10 is not limited to the solid state imaging device.

Further, a circuit component on which the electronic component described in the above embodiments is mounted can be applied to various electronic equipment. The electronic equipment is not limited in particular and may be a digital still camera, a video camera, a smartphone, a personal computer, a home appliance (IoT), or the like, for example.

Further, the electronic component described in the above embodiments can be applied to a transport equipment having a moving apparatus. For example, the transport equipment may have a control apparatus that controls a moving apparatus based on a signal output from the electronic component described in the above embodiments. The moving apparatus is not limited in particular and may be a motive power source or a driving mechanism such as an engine, a motor, a wheel, a propeller, or the like, for example. The transport equipment is not limited in particular and may be an airplane, a vehicle, a vessel, or the like, for example.

Further, respective terms in the present specification are used for only the purpose of illustrating the present invention and may include their equivalents, and the present invention is not limited to the strict meaning of the terms.

Each of the embodiments described above merely illustrates embodied examples in implementing the present invention, and the technical scope of the present invention should not be construed in a limiting sense by these embodiments. That is, the present invention can be implemented in various forms without departing from the technical concept of the invention or primary features thereof.

As described above in detail, the present invention allows for reduction in size of an electronic component.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-044645, filed Mar. 9, 2017, which is hereby incorporated by reference herein in its entirety.

What is claimed is:

1. An electronic component comprising:
   a support member in which a recess part having a bottom face and a side face is provided; and
   a device unit that includes a substrate and fixed to the support member so that a primary face of the substrate faces the recess part,
   wherein an opening width of the recess part is, on a side of a bottom of the recess part with respect to the primary face, narrower than a width of the device unit and, on an opposite side of the bottom of the recess part with respect to the primary face, wider than the width of the device unit,
   wherein an end face of the substrate overlaps with the side face of the recess part in a direction perpendicular to the primary face of the substrate, and
   wherein a photoelectric conversion element is arranged on the primary face of the substrate.

2. The electronic component according to claim 1, wherein the side face has a slope face inclined relative to the primary face of the substrate, the bottom face is parallel to the primary face, and the slope face is inclined relative to the bottom face.

3. The electronic component according to claim 2, wherein a boundary region between the primary face and the end face of the device unit is in contact with the slope face of the recess part.

4. The electronic component according to claim 3, wherein the boundary region is inclined relative to the primary face and the end face.

5. The electronic component according to claim 1,
wherein the support member includes a first interconnection layer provided on the side face of the recess part,
wherein the device unit includes a second interconnection layer arranged in a boundary region between the primary face and the end face of the device unit, and
wherein the first interconnection layer and the second interconnection layer are electrically connected to each other above the side face.

6. The electronic component according to claim 5, wherein the second interconnection layer extends to a face outside the recess part of the support member.

7. The electronic component according to claim 1, wherein the device unit includes an external connection terminal on a side opposite to the recess part.

8. The electronic component according to claim 1, wherein the device unit includes a semiconductor substrate and a mounting substrate on which the semiconductor substrate is mounted, and the mounting substrate has the primary face and the end face.

9. The electronic component according to claim 1, wherein the recess part is closed by the device unit.

10. The electronic component according to claim 1, wherein the device unit protrudes out of the support member on a side opposite to the primary face.

11. An electronic component comprising:
a support member in which a recess part having a bottom face and a side face is provided;
a device unit that includes a substrate and is fixed to the support member so that a primary face of the substrate is parallel to the bottom face of the recess part; and
a resin member provided between an end face of the device unit and the side face of the recess part,
wherein an opening width of the recess part is, on a side of a bottom of the recess part with respect to the primary face, narrower than a width of the device unit and, on an opposite side of the bottom of the recess part with respect to the primary face, wider than the width of the device unit,
wherein a void is provided between the device unit and the bottom face of the recess part, and
wherein the resin member does not extend between the primary face of the device unit and the bottom face.

12. The electronic component according to claim 11, wherein a boundary region between the primary face and the end face of the device unit is in contact with the side face of the recess part.

13. The electronic component according to claim 12, wherein the boundary region is inclined relative to the primary face and the end face.

14. The electronic component according to claim 11,
wherein the support member includes a first interconnection layer provided on the side face of the recess part,
wherein the device unit includes a second interconnection layer arranged in a boundary region between the primary face and the end face of the device unit, and
wherein the first interconnection layer and the second interconnection layer are electrically connected to each other above the side face.

15. The electronic component according to claim 14, wherein the second interconnection layer extends to a face outside the recess part of the support member.

16. The electronic component according to claim 11, wherein the device unit includes an external connection terminal on a side opposite to the recess part.

17. The electronic component according to claim 11, wherein the device unit includes a semiconductor substrate and a mounting substrate on which the semiconductor substrate is mounted, and the mounting substrate has the primary face and the end face.

18. The electronic component according to claim 11, wherein the device unit protrudes with respect to the support member on a side opposite to the primary face.

19. An equipment comprising:
the electronic component according to claim 1;
a circuit component on which the electronic component is mounted; and
a device to which a signal output from the electronic component is input.

20. An equipment comprising:
the electronic component according to claim 11;
a circuit component on which the electronic component is mounted; and
a device to which a signal output from the electronic component is input.

* * * * *